(12) United States Patent
Kragl

(10) Patent No.: US 6,504,107 B1
(45) Date of Patent: Jan. 7, 2003

(54) ELECTRO-OPTIC MODULE AND METHOD FOR THE PRODUCTION THEREOF

(75) Inventor: Hans Kragl, Diekholzen (DE)

(73) Assignee: Harting Elektro-optische Bauteile GmbH & Co. KG (DE)

( * ) Notice: Subject to any disclaimer, the term of this patent is extended or adjusted under 35 U.S.C. 154(b) by 0 days.

(21) Appl. No.: 09/831,286
(22) PCT Filed: Nov. 5, 1999
(86) PCT No.: PCT/EP99/08485
§ 371 (c)(1), (2), (4) Date: Jul. 23, 2001
(87) PCT Pub. No.: WO00/28362
PCT Pub. Date: May 18, 2000

(30) Foreign Application Priority Data

Nov. 6, 1998 (DE) .......................................... 198 51 265

(51) Int. Cl.[7] ........................ G02B 6/42; H01L 31/0232
(52) U.S. Cl. ........................... 174/260; 257/81; 257/99; 385/75; 385/92; 438/25; 438/27; 438/64; 438/65
(58) Field of Search .............................. 257/81, 82, 99, 257/432–434; 385/75, 92–94, 146, 147; 250/239, 227.24; 438/27, 65, 25, 26, 64, 116; 361/760, 761, 764, 767, 768, 782, 783, 807, 808, 809, 820; 174/260; 29/832, 834–836, 848, 849, 25.01

(56) References Cited

U.S. PATENT DOCUMENTS

| 4,611,884 A | | 9/1986 | Roberts ....................... 385/44 |
| 5,233,178 A | * | 8/1993 | Tokunaga .................... 250/239 |
| 5,432,878 A | * | 7/1995 | Smous ......................... 385/92 |
| 5,454,055 A | * | 9/1995 | Kragl et al. .................... 385/14 |
| 5,479,540 A | * | 12/1995 | Boudreau et al. .............. 385/92 |
| 5,739,800 A | * | 4/1998 | Lebby et al. ................... 257/81 |
| 5,799,117 A | * | 8/1998 | Kragl et al. ..................... 385/14 |
| 5,987,202 A | | 11/1999 | Gruenwald et al. ........... 385/49 |

FOREIGN PATENT DOCUMENTS

| DE | 37 37 251 | | 5/1989 |
| DE | 43 13 487 | | 5/1994 |
| DE | 195 47 941 | | 7/1996 |
| EP | 0 320 722 | | 6/1989 |
| EP | 0 529 947 | | 3/1993 |
| EP | 0 550 973 | | 7/1993 |
| EP | 0 611 975 | | 8/1994 |
| EP | 0 723 171 | | 7/1996 |
| GB | 2 288 035 A | * | 10/1995 |

OTHER PUBLICATIONS

English Translation of International Preliminary Examination Report of PCT/EP99/08485.

(List continued on next page.)

Primary Examiner—Kamand Cuneo
Assistant Examiner—John B. Vigushin
(74) Attorney, Agent, or Firm—Cook, Alex, McFarron, Manzo, Cummings & Mehler, Ltd.

(57) ABSTRACT

An assembly unit comprises a printed circuit board (10) and an optical component (54, 56, 58), the printed circuit board (10) being provided with at least one electro-optical component (16), at least one conducting track (24) for the connection of the electro-optical component (16), as well as a three-dimensional, microstructured adjustment formation (12), the electro-optical component (16) being precisely arranged relative to the latter, and a three-dimensional positioning formation (52) being provided on the optical component (54, 56, 58) and cooperating with the adjustment formation (12) of the printed circuit board (10) in such a way that the optical component (54, 56 58) is precisely coupled with the electro-optical component (16) of the printed circuit board (10).

24 Claims, 9 Drawing Sheets

OTHER PUBLICATIONS

"Multi–Waveguide/Laser Coupling," IBM Technical Disclosure Bulletin. vol. 31, No. 10, Mar. 1989, pp. 384–387.
English abstract of DE 37 37 251, published May 18, 1989.
English abstract of DE 43 13 487, published May 26, 1994.
English abstract of JP 05–113526, published May 7, 1993.
English abstract of JP 08–192532, published Jul. 30, 1996.
English abstract of JP 61–287264, published Dec. 17, 1996.
International Search Report for PCT/EP99/08485.

* cited by examiner

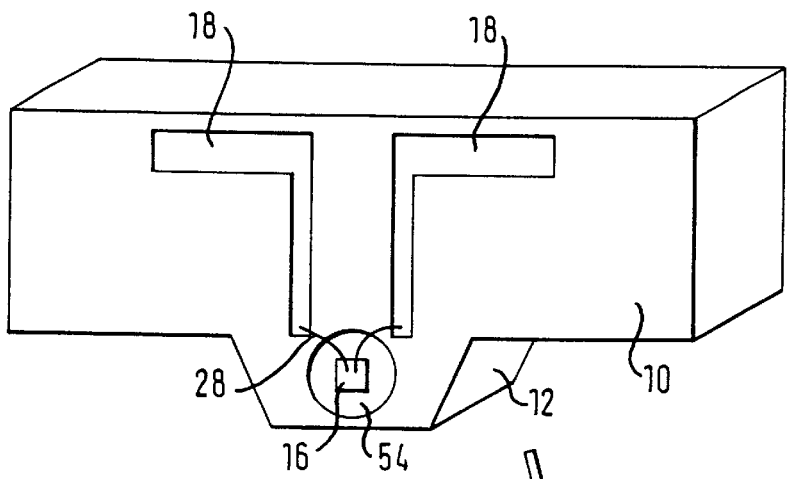
Fig. 19
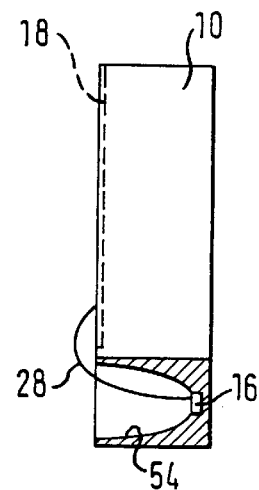
Fig. 20
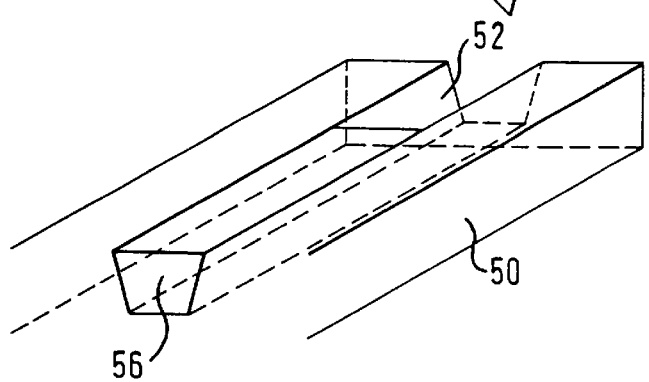

ELECTRO-OPTIC MODULE AND METHOD FOR THE PRODUCTION THEREOF

BACKGROUND OF THE INVENTION

The invention relates to an assembly unit which consists of a printed circuit board with an electro-optical component and of an optical component. The invention further relates to a method of producing such an assembly unit.

In the field of integrated optics there are known assembly units in which electro-optical components such as laser diodes, LEDs and photodetectors are coupled with an optical component, for instance an optical fiber or a waveguide. For this purpose, the electro-optical components are arranged on a substrate on which the optical component is arranged, too. An example of such an assembly unit is known from the German Laid-open Document 44 10 740 in which a photodetector is coupled with an optical fiber. The photodetector and the optical fiber are received in a two-piece substrate, with a waveguide trench being provided in one substrate part, which trench is filled up by the optically transparent adhesive substance used upon bonding the two substrate parts with each other, so that a waveguide is formed which couples the photodetector and the waveguide with each other.

On producing such an assembly group there occur in particular two problems. Firstly, a precise positioning of the electro-optical component relative to the optical component can be done only with a large expenditure, for instance by using guiding slopes which are intended to provide for the optimum alignment. Examples of such configurations are known from the German Laid-open Documents 44 01 219 and 42 32 608. Secondly, there results a comparably high reject rate, because the optical member which is coupled with the electro-optical component, i.e. the waveguide in the cited example, is formed only with the final step of bonding the two substrate parts to each other. If the waveguide is defective, this will mean that also the photodetector has to be rejected, as it is inseparably linked with the assembly unit. The problem of the high reject rate is the larger, the more components have to be combined with each other. If, for example, a process consisting of 200 individual steps leads to a yield of 80%, this will mean that each individual step has to be performed with a yield of 99.9%. It is for this reason that the monolithic integration—in discussion as an alternative production method and theoretically promising a very good coupling of the components used—i.e. the production of electronics, opto-electronics and optics including waveguides in a single material system such as InP, for instance, will still not be utilizable for some time.

An additional problem consists in the need of achieving the required electrical terminals of the electro-optical component. When the electro-optical component is embedded in a substrate, conductors or the like have to be provided for a supply line.

From prior art it is further known to arrange electro-optical components, in particular electro-optical semiconductors, on printed circuit boards. For this, preferably the Lead Frame technology is used by means of which an electro-optical chip can be arranged on the printed circuit board with an accuracy of approximately 50 $\mu$m. This accuracy, however, is not sufficient for the adjustment relative to an optical waveguide which may have dimensions in the range of down to 1 $\mu$m.

SUMMARY OF THE INVENTION

The invention provides an assembly unit in which an optical component is arranged relative to an electro-optical component with the desired accuracy. The invention further provides a method for the production of such an assembly unit, which is distinguished by a high yield.

The assembly unit according to the invention consists of a printed circuit board and an optical component, the printed circuit board being provided with at least one electro-optical component, at least one conducting track for the connection of the electro-optical component, as well as a three-dimensional, microstructured adjustment formation, the electro-optical component being precisely arranged relative to the latter, and a three-dimensional positioning formation being provided on the optical component and cooperating with the adjustment formation of the printed circuit board in such a way that the optical component is precisely coupled with the electro-optical component of the printed circuit board. The assembly unit according to the invention thus consists of two subassembly units, namely first the printed circuit board with the electro-optical component and, secondly, the optical component itself. These are each operative for themselves, so that they can be checked separately from each other. So there is the possibility of checking, with regard to the printed circuit board, whether the conducting tracks for the connection of the electro-optical component, the connection of the electro-optical component with the conducting tracks and, finally, the electro-optical component itself are fully operative. With regard to the optical component, for instance a waveguide or an optical fiber, there is the possibility to check whether its function is in order. It is only upon assembly of the printed circuit board and the optical component that the electro-optical component is coupled with the optical component, namely in a passive way via the adjustment and positioning formations.

According to a preferred embodiment it is provided that the printed circuit board is an injection-molded part which is partially provided with a metallization. In this way there results an efficient manufacturing of the printed circuit board, as all formations which are required for precisely positioning the electro-optical component, for instance a microstructured depression, as well as the adjustment formation, for instance a raised adjustment cross, are able to be formed in a simple way from a suitably configured mold. The increased expenditure for the precise manufacturing has to be spent in this method only once, namely for producing the injection mold; the structures formed there with the required precision are then simply copied to the injection-molded part with the same accuracy.

According to a preferred embodiment it is provided that a cooling body is arranged at the bottom of the depression, the latter accommodating the electro-optical component. This cooling body serves the purpose to carry off the dissipated heat, in particular the heat from electro-optical transmission elements. The cooling body can consist of a metal layer, for example, which is simultaneously formed with the metallization of the printed circuit board. In this case the cooling body may be used as one of the terminals for the electro-optical component, if this terminal is connected with the cooling body in an electrically conductive way, for instance by conductive bonding.

According to the preferred embodiment it is further provided that a press fit is present between the electro-optical component and the depression of the printed circuit board. The press fit ensures the precise arrangement of the electro-optical component in the depression, without additional measures for securing the electro-optical component being necessary.

According to a preferred embodiment it is provided that the electro-optical component has a rectangular base and the depression is formed by a circular milled receiving hole, the dimensions of which are smaller than the diagonals of the base, and that four adjustment holes are provided which are assigned to the corners of the electro-optical component and whose lines of intersection with the wall of the milled receiving hole serve for precisely aligning the electro-optical component. It is by means of the milled receiving hole that the depression of the electro-optical component can be formed in a very precise way with an even base. The adjustment holes make it possible to hold the electro-optical component in the milled receiving hole so as to be precisely aligned therein.

According to a preferred embodiment it is provided that the electro-optical component is a component which emits light without preferred direction perpendicular to its surface, and the wall of the depression forms a parabolic reflector which focuses the emitted light towards the optical component. Electro-optical components radiating light without preferred direction are in particular LED chips. The light emitted from the LED chip, which is radiated outside the angle of acceptance of the associated optical component, would be lost if e.g. the parabolic reflector was not used for forming the beam. Such a parabolic reflector replaces a focusing lens which could be employed as an alternative, but also stands for a very much higher manufacturing expenditure. The reflective layer of the parabolic reflector can be formed by the metallization in a particularly simple way, this metallization being applied onto the printed circuit board for forming the conducting tracks, too.

As an optical component an optical fiber may be used, for example, the outer contour of which forms the positioning formation, and the adjustment formation of the printed circuit board and cooperating with the positioning formation may be formed by a guiding groove for the optical fiber, the fiber being received in the groove. In this embodiment of the invention, the optical component is directly aligned by means of its outer geometry—formed in the nature of a microstructure with the required precision—on the adjustment means and, hence, relative to the electro-optical component of the printed circuit board, so that the desired electrical coupling between the electro-optical component and the optical component is obtained. The guiding groove is preferably formed with a V-shaped cross-section.

The optical component can be alternatively arranged on a substrate on which the positioning formation is formed, the latter being microstructured. In this embodiment of the invention, the optical component is indirectly aligned relative to the electro-optical component, with interposition of the substrate. This is particularly recommendable if the optical component is a waveguide or a mirror. In these cases, the optical components need the substrate quasi as a carrier structure. The waveguide is in fact usually formed in a waveguide trench in the substrate, and the mirror may be formed by a surface which is made so as to be reflective and has a suitable geometric structure, so that for instance a concave mirror is provided which—in a way similar to a parabolic reflector—focuses the light provided by the electro-optical component towards a further optical component, for instance the end face of an optical fiber.

A method according to the invention for producing an assembly unit of a printed circuit board on which at least one electro-optical component is arranged, and of an optical component which is coupled with the electro-optical component, comprises the following steps: a printed circuit board blank is provided, a depression for receiving the electro-optical component and a three-dimensional adjustment formation being formed; then, the printed circuit board blank is finished by it being partially metallized, so that a conducting track is formed; Subsequently, the electro-optical component is arranged in the depression and connected with the conducting track; further, an optical component is provided separately from the printed circuit board, which optical component is provided with a three-dimensional positioning formation; finally, the printed circuit board and the optical component are assembled, the adjustment and positioning formations engaging into each other and leading to a precise alignment of printed circuit board and optical component relative to each other; in a last step the printed circuit board and the optical component are secured to each other. This method allows to manufacture the assembly group in a particularly economic way, because, as is preferably provided, both the electro-optical component of the printed circuit board and the optical component can be checked in terms of their correct functioning prior to joining the printed circuit board and the optical component. In case that a correct functioning can not be determined, only the subassembly concerned has to be rejected, so that the overall reject rate of the method is considerably improved. The precise alignment of the components relative to each other, which is necessary for the coupling between the electro-optical component and the optical component, is obtained so to speak automatically in a passive way by the mutual engagement between adjustment and positioning formations.

If the printed circuit board blank is injection-molded, as this is provided according to a preferred embodiment, then the depression for receiving the electro-optical component and the three-dimensional adjustment formation are formed from the injection mold, so that they are obtained with the required precision without any further working steps.

According to a preferred embodiment it is provided that for arranging the electro-optical component in the depression, the printed circuit board is heated. The thermal expansion occurring with heating makes it possible to freely insert the component into the depression. The shrinkage occurring on cooling down results in that the electro-optical component is safely and reliably retained in the depression with an appropriate press-fit, without further steps being necessary. For arranging the electro-optical component in the depression, it is as an alternative also possible to bend the printed circuit board such that the depression enlarges towards outside. If the printed circuit board with the electro-optical component inserted therein returns to its initial position, the walls of the depression will firmly press against the electro-optical component which in this way is firmly held in the depression.

According to a preferred embodiment it is provided that the printed circuit board and the optical component are directly bonded to each other. In this way the printed circuit board and the optical component are reliably joined to each other, and the adhesive substance can be additionally used for filling up a possible free space between the corresponding faces of the electro-optical component and the optical component. The quality of the coupling between both components will be enhanced if the adhesive substance consists of a highly transparent material and completely fills up the free space in the beam path between the electro-optical component and the optical component, this, however, not being strictly necessary.

According to a preferred embodiment it is provided that the optical component is attached to a substrate on which the positioning formation is formed and which is joined to the printed circuit board. This results in a higher freedom in terms of the type of connection between the printed circuit board and the optical component. As an alternative to the bonding mentioned above it can also be provided that the printed circuit board and the substrate are soldered to each other. For this, in particular the metallization can be made use of, which is applied onto the printed circuit board, as well as a metallization which at option is applied onto the substrate and acts there, for instance, as a reflective surface in the nature of a mirror.

BRIEF DESCRIPTION OF THE DRAWINGS

Advantageous designs of the invention will be apparent from sub-claims.

The invention will now be described with reference to various embodiments which are illustrated in the attached drawings in which:

FIG. 19 shows an assembly unit according to an eighth embodiment of the invention in a perspective exploded view; and FIG. 20 shows a part of the assembly unit of the eighth embodiment of the invention in a side view.

DETAILED DESCRIPTION OF THE INVENTION

Figure 1:
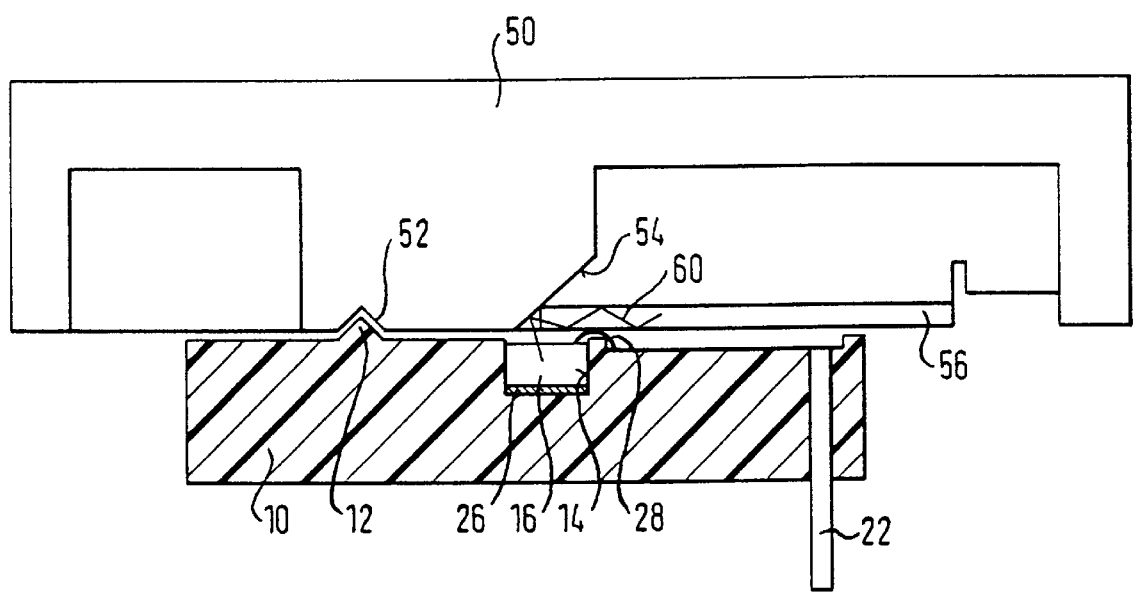
FIG. 1 shows in a schematic sectional view an assembly unit according to a first embodiment of the invention.

An assembly unit according to the invention is schematically shown in FIG. 1. It consists of a printed circuit board 10 and two optical components, here a mirror 54 and a waveguide 56 which are formed on a substrate 50.

The printed circuit board 10 (see also FIGS. 2 and 3) is preferably produced in a formation method, in particular in injection molding technology. In this way an adjustment formation 12 is formed on the surface of the printed circuit board, this formation being a raised adjustment cross here. Further, in its surface a depression 14 is formed which serves to receive an electro-optical component 16. The electro-optical component can be in particular an electro-optical chip, for example a laser diode, an LED, a VCSEL chip or a photodetector. Both the adjustment cross 12 and the depression 14 are precisely microstructured in terms of their geometric shape and also their arrangement relative to each other. This means that there is kept to a desired geometry with a very high accuracy in the range of 1 $\mu$m.

Moreover, two grooves 18 are formed on the surface of the printed circuit board 10, which later serve for forming conducting tracks. At one end of the grooves 18 there are formed holes 20 for receiving contact pins 22.

Figure 2:
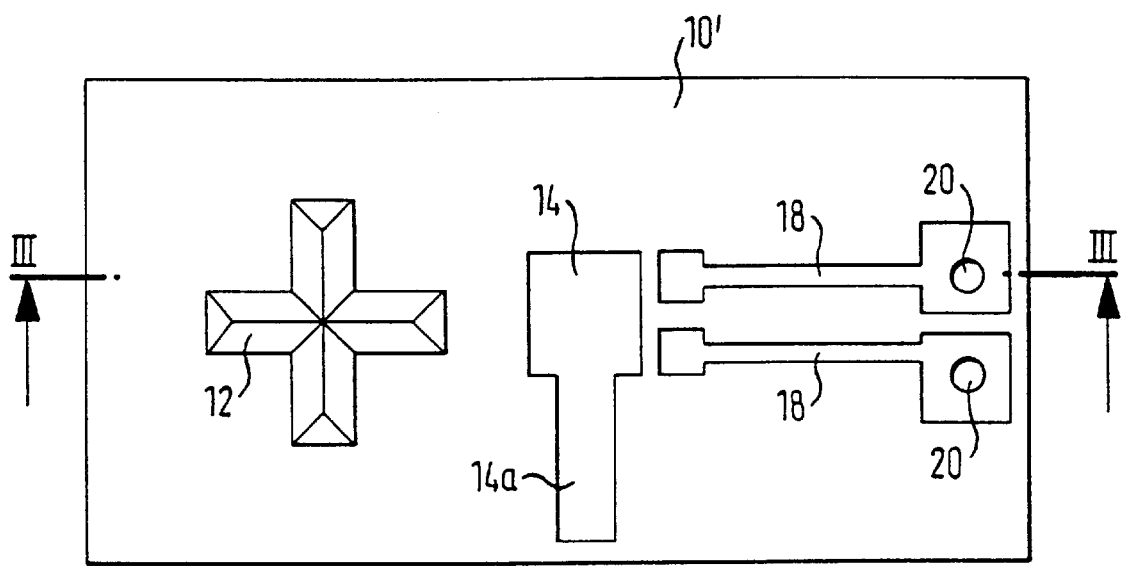
FIG. 2 shows a printed circuit board used in the assembly unit of FIG. 1 in a top view, prior to being equipped with the electro-optical component.
Figure 3:
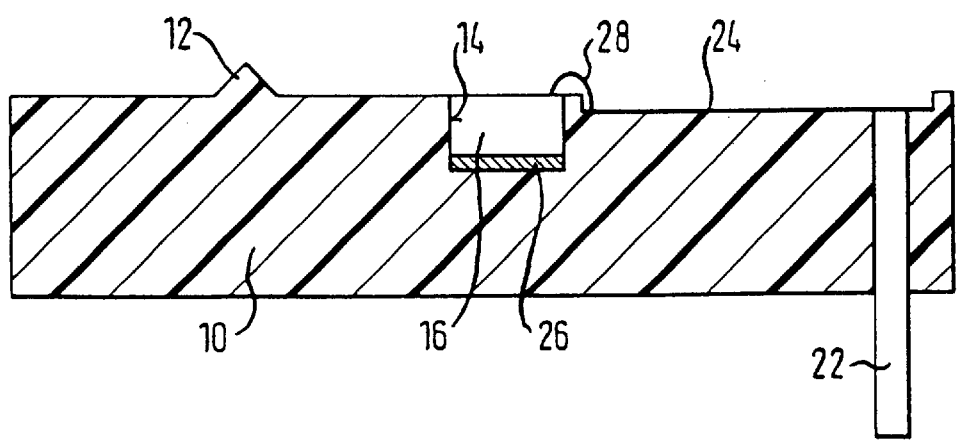
FIG. 3 shows the printed circuit board of FIG. 2 in a sectional view along line III—III of FIG. 2 after being equipped with an electro-optical component.

In order to obtain a finished printed circuit board, starting from the printed circuit board blank 10' shown in FIG. 2, the surface of the printed circuit board blank 10' has to be provided with a metallization in the desired areas. To this purpose the blank is firstly cleaned by a plasma-jet, and subsequently the surface is metallized by a chemical method or a vacuum evaporation method. The metallization formed in this way on the surface is very thin, so that it can be polished or ground off from all raised areas without any problems, i.e. all areas apart from the depression 14 and the trenches 18. Then, the thin metal layer is thickened by a chemical or galvanic method, with the contact pins 22 having been arranged in the holes 20 beforehand. In this way a conducting track 24 is formed in each groove 18, which track is in electrical connection with the corresponding contact pin 22. A metal layer 26 can additionally be formed on the bottom of the depression 14, this layer serving as a cooling body for the electro-optical component which later is inserted in the depression 14. The cooling body extends into an extension 14a of the depression, so that a larger area is available for the cooling effect. In the view of acting as a cooling body, it is necessary to configure the metal layer with a larger thickness than for formation of the conducting tracks 24. To this end, differing voltages can be applied to the metallized portions in the grooves 18 and the bottom of the depression 14, respectively, in order to deposit differing amounts of material at these places.

Finally, the electro-optical component 16 is inserted in the depression 14 and connected with the two conducting tracks 24 by one bond wire 28 each. Establishing the electrical connection by conductive bonding is also possible.

The cooling body 26 may alternatively be used as an electrical terminal of the electro-optical component 16. In this case, the underside of the component 16 is connected with the cooling body 26 in an electrically conductive way by means of soldering or conductive bonding. Only one bonding wire 28 is required then for forming the second terminal of the electro-optical component via one of the conducting tracks 24. Independently of the type of electrical connection of the electro-optical component, a connection with the cooling body 26 has to be ensured that is well heat-conducting.

The electro-optical component 16 is now precisely arranged relative to the adjustment cross 12.

If also an electrical signal processing is to be performed on the printed circuit board, then it is possible to additionally employ and connect in like manner semi-conductor chips with purely electronic functions such as drivers or preamplifiers, as well as other electronic components. However, it is not required for purely electronic chips to arranged these with that accuracy relative to the adjustment cross with which the electro-optical chip was arranged.

Arranged on the substrate 50 is a positioning means 52 consisting of a geometric structure which is inverse to the adjustment formation 12 of the printed circuit board, in that case an adjustment cross which is formed so as to be deepened. The substrate 50 is further provided with the optical components mirror 54 and waveguide 56 which have been briefly mentioned above. The waveguide can be formed by known methods of microstructuring technology and the mirror 54 can be formed by a metallization applied onto an inclined surface of the substrate.

The positioning formation 52 is microstructured in the same way as the adjustment formation 12 and the two optical components 54 and 56 are precisely arranged relative to the positioning formation.

The assembly unit is then obtained by assembling the printed circuit board 10 and the substrate 50. In so doing, there occurs due to a mutual engagement of adjustment formation 12 and positioning formation 52 a precise arrangement of printed circuit board and substrate relative to each other, and thus of the components attached to these. The electro-optical component 16 of the printed circuit board is, hence, located in a position which is required for an optical coupling with the mirror 54 and the waveguide 56. This is indicated by a schematically illustrated beam path 60.

The printed circuit board 10 and the substrate 50 are finally joined to each other. This may be done by soldering, for example, metallized areas on the printed circuit board 10 and the substrate 50 being preferably used for this. Preferably, the printed circuit board and the substrate are bonded to each other, and when the adhesive substance has been suitably selected, the free space between the electro-optical component of the printed circuit board and the optical component of the substrate in the beam path between the two components can be completely filled up with a highly transparent adhesive substance for improving the optical coupling.

Since the printed circuit board blank 10' shown in FIG. 2 bears at the same time raised and deepened structures, the tool for its production can not be produced by means of microstructure technology—which is very common in the field of integrated optics—as this technology normally does not make possible any application of material. Therefore, one has to fall back upon the technology of galvanic copying by means of which raised and deepened structures can be formed. There is additionally the problem that that the depression 14 in the printed circuit board has to be formed with perpendicular walls. This is not feasible with the most technologies available, apart from the LIGA method which, however, is very costly.

Figure 4:
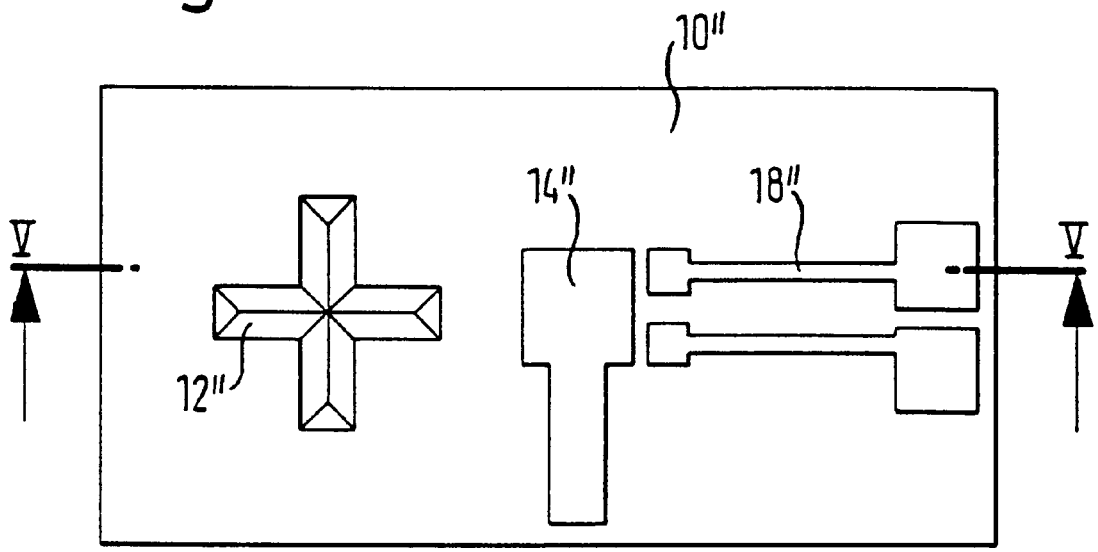
FIG. 4 shows in a top view a silicon masterpiece which is used for producing the printed circuit board blank of FIG. 2.
Figure 5:
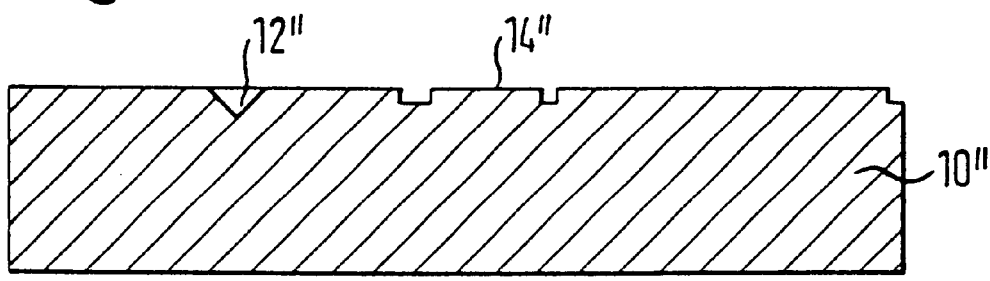
FIG. 5 shows the silicon masterpiece of FIG. 4 in a sectional view along line V—V FIG. 4.
Figure 6:
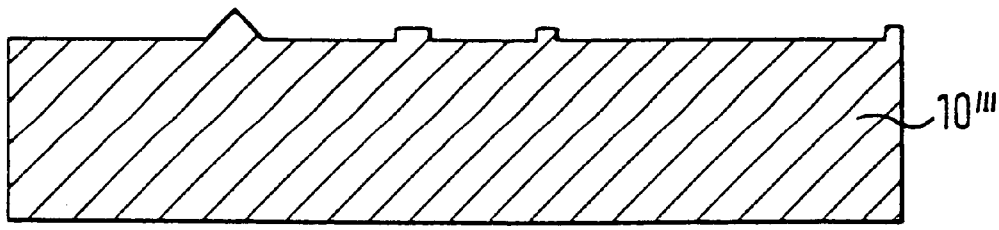
FIG. 6 shows in a sectional view corresponding to plane V—V of FIG. 4 a nickel workpiece which has been obtained by taking a casting from the silicon masterpiece of FIG. 5.

In FIGS. 4 to 6 there is shown how the tool for formation of the printed circuit board blank can be obtained. In FIG. 4 is shown a silicon masterpiece 10'' the surface of which, being inverse to the printed circuit board blank 10', has been formed by means of silicon micromechanics. The adjustment cross 12 formed on the printed circuit board blank 10' so as to be raised is formed as a deepened adjustment cross 12'' (by KOH etching), and the grooves 18, for the conducting tracks, formed on the printed circuit board blank 10' so as to be deepened are formed so as to be locally raised, by removing the external rim portions of the deepened structures by RIE etching. In the sectional view along plane V—V of FIG. 4 it is to be seen that the external rim portions of the depression 14 to be formed on the printed circuit board blank 10' have been etched away, so that the areas 14'' which later will correspond to the depression 14, seem to be raised with respect to the local surroundings.

Figure 7:
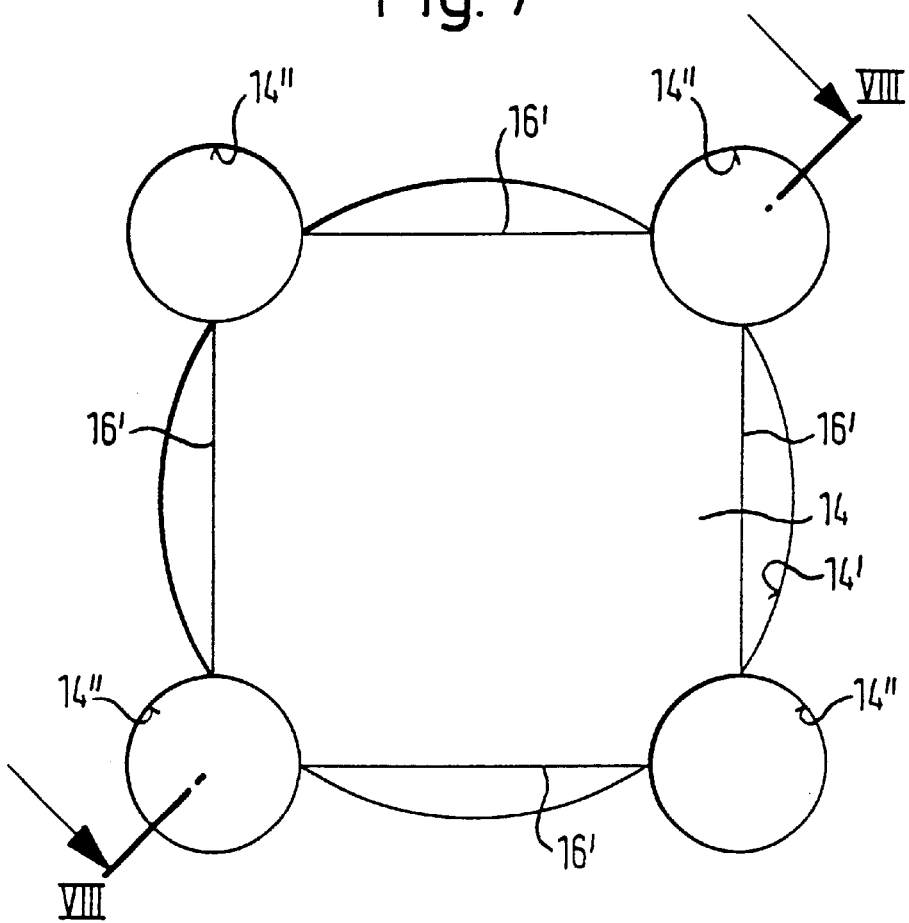
FIG. 7 shows in a schematic top view a depression which may be used for receiving an electro-optical component in a printed circuit board.
Figure 8:
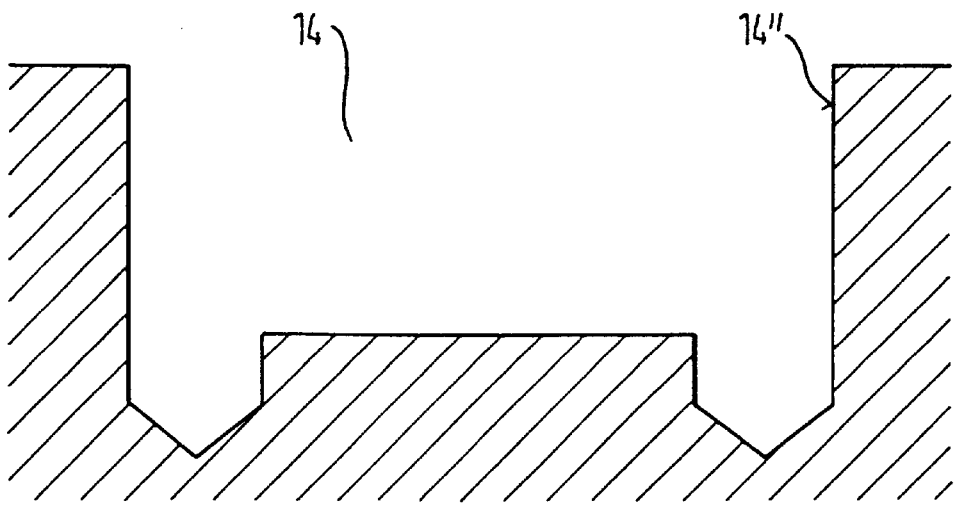
FIG. 8 shows a sectional view along line VIII—VIII of FIG. 7.

Next, galvanic copying (one time or in an odd number) is done with the silicon masterpiece 10'', so that the tool 10''' (shown in FIG. 6) of nickel is produced, which is of first, third, . . . generation. This tool can now be structured in the desired manner with an NC drilling and milling machine. An example of the depression 14 for receiving the electro-optical component is shown in FIGS. 7 and 8. The depression 14 is formed by a large receiving hole which as a milled hole with an even bottom area is currently technically realizable with a diameter of down to approximately 300 $\mu$m. The cylindrical wall 14' formed in this way has a diameter which is smaller than a diagonal of the electro-optical component to be received later in the depression 14. At each of those places where the corners of the electro-optical component will later come to lie there is formed one adjustment hole having a diameter which is smaller than the diameter of the receiving hole and can have in particular a value of below 100 $\mu$m. The adjustment holes and the receiving hole overlap, so that also the walls 14'' of the adjustment holes intersect with the wall 14' of the receiving hole. The lines of intersection occurring therewith, eight all told, serve for the precise alignment of the electro-optical component in the depression 14 by two lines of intersection engaging the one and other side, respectively, of each corner of the electro-optical component.

In FIG. 8 one can see particularly well the even base which is formed in this way and later serves for the precise arrangement of the electro-optical component in the depression. The margins of the component received in the depression 14 are indicated in FIG. 7 by reference numeral 16. A component having a square base is shown here as an example; in the same way, also a component with a rectangular base could be used. In this case only the receiving hole would have to be formed so as to have a somewhat elongated shape.

Figure 9:
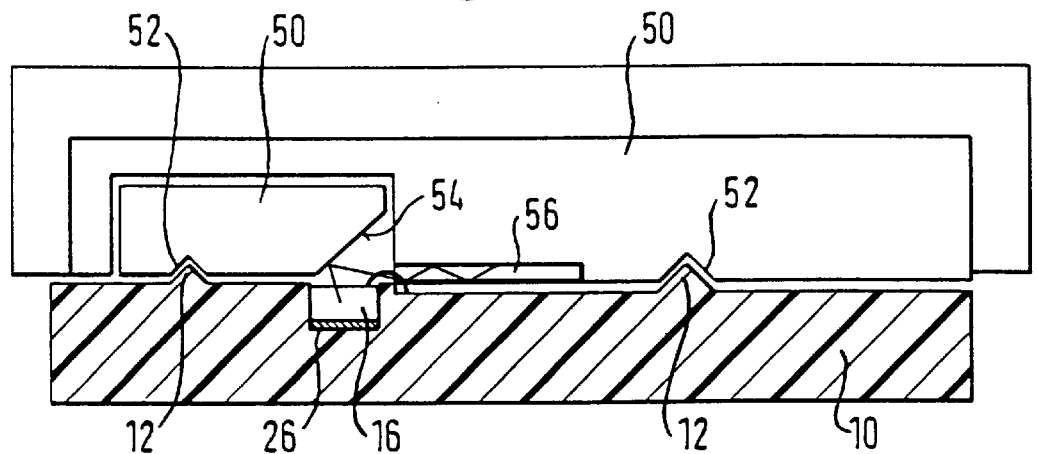
FIG. 9 shows an assembly unit according to a second embodiment of the invention in a schematic sectional view.

In FIG. 9 there is shown a second embodiment of an assembly unit according to the invention. Two substrates 50 are used here, one carrying a mirror 54 and the other a waveguide 56. Each substrate is provided with a positioning formation 52, so that the two optical components 54, 56 are optimally aligned and the electro-optical component 16 is linked with the waveguide 56 by end face coupling via the mirror 54.

Figure 10:
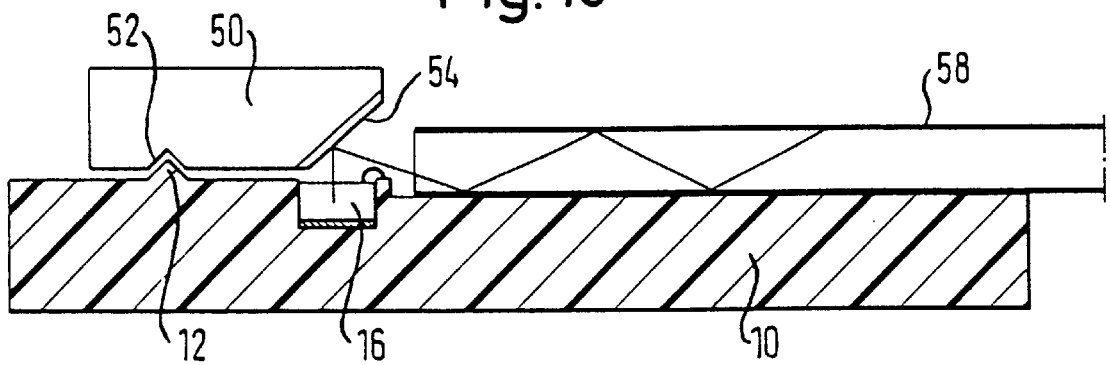
FIG. 10 shows an assembly unit according to a third embodiment of the invention in a schematic sectional view.

In FIG. 10 there is shown a third embodiment of an assembly unit according to the invention. Here is used as an optical component, to name first, a mirror 54 which is formed by a metallized face of the substrate 50. As in this embodiment the substrate 50 is not an integrated-optical substrate, it can be produced with the required precision as an injection-molded part, for instance.

An optical fiber 58 is employed as the second optical component, which fiber is coupled with the electro-optical component 16 by end face coupling via the mirror 54. The optical fiber 58 is received in a guiding groove in the printed circuit board. At the same time, the guiding groove serves as an adjustment formation and the outer contour of the optical fiber 58 serves as a positioning formation which in cooperation with the adjustment formation precisely aligns the optical fiber relative to the mirror 54 and the electro-optical component 16.

Figure 11:
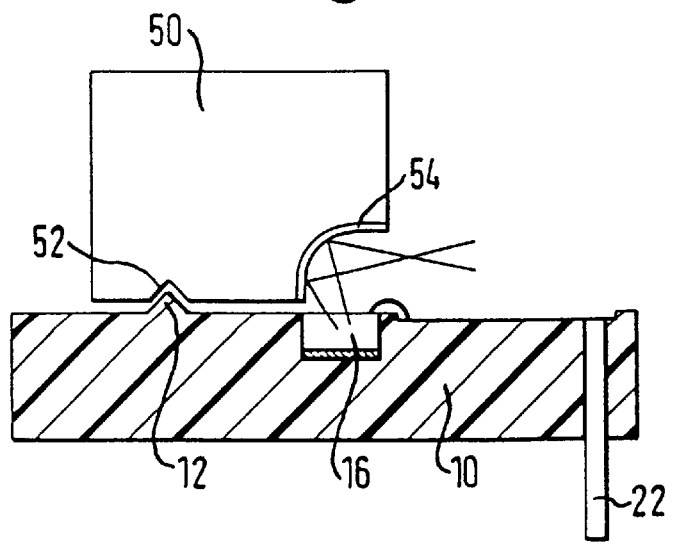
FIG. 11 shows an assembly unit according to a fourth embodiment of the invention in a schematic sectional view.

In FIG. 11 there is shown a fourth embodiment of an assembly unit according to the invention. In this embodiment, the mirror 54 is formed on the substrate 50 as a concave mirror, so that it may be used for forming the beam. This is an advantage if the used electro-optical component 16 radiates light without preferred direction perpendicular to the surface, as is the case with an LED chip, for example. The curved surface on the substrate 50 that is required for producing the mirror 54 can be achieved by formation in an injection molding method, for example.

Figure 12:
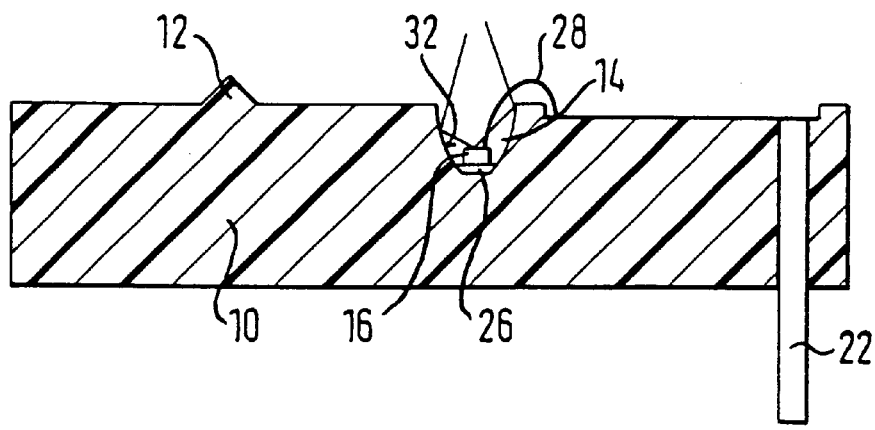
FIG. 12 shows a printed circuit board for an assembly unit according to a fifth embodiment of the invention in a schematic sectional view.

In FIG. 12 there is shown a printed circuit board for an assembly unit according to a fifth embodiment of the invention. In this embodiment, a parabolic reflector 32 is used for beam forming, which reflector is formed by the suitably shaped wall of the depression 14 in which the electro-optical component 16 has been inserted. The parabolic surface can readily be achieved by use of a correspondingly ground milling cutter for finishing the milled hole, as it is basically known from FIGS. 7 and 8. The reflective coating of the reflector 32 can be achieved by means of the metallization which is applied for producing the conducting tracks 24. It should be taken into consideration here that the bond wires 28 used for the connection of the electro-optical component 16 have to be arranged very carefully, so that a short-circuiting is prevented. Also in this embodiment the electro-optical component 16 is bonded with a cooling body 26 which is formed on the bottom of the depression 14.

Figure 13A:
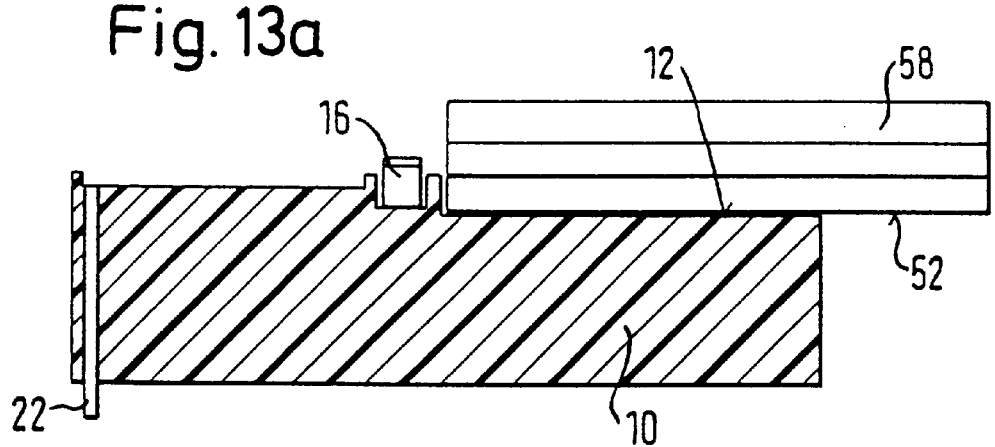
FIG. 13a shows an assembly unit according to a sixth embodiment of the invention in a schematic sectional view.
Figure 13B:
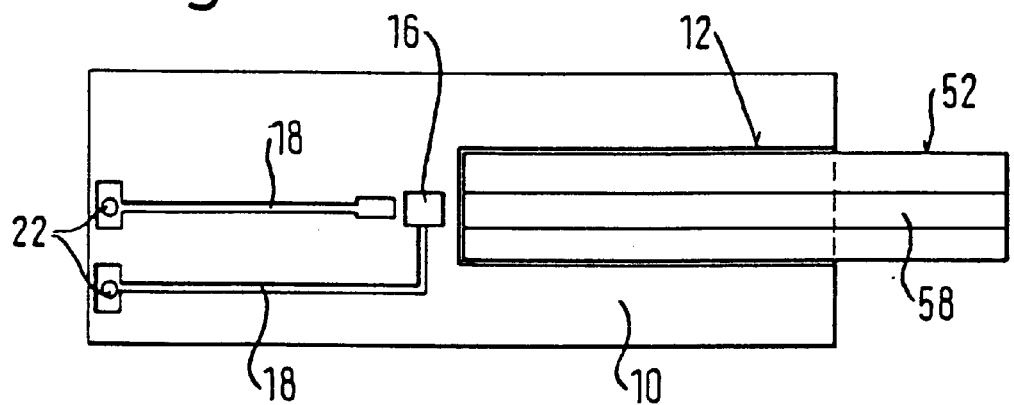
FIG. 13b shows the assembly unit of FIG. 13a in a top view.

In FIGS. 13*a* and 13*b* there is shown an assembly unit according to a sixth embodiment. In this embodiment, an edge-emitter laser diode 16 is inserted as electro-optical component in the depression 14. This is directly coupled with the optical component, i.e. without any interposed mirrors etc., the component being designed here as an optical fiber 58. A guiding groove 12 having a V-shaped cross-section serves as adjustment formation. As positioning formation serves the outer contour 52 of the optical fiber 58, which is formed with the required precision for maintaining the required alignment relative to the edge-emitter LD.

Figure 14:
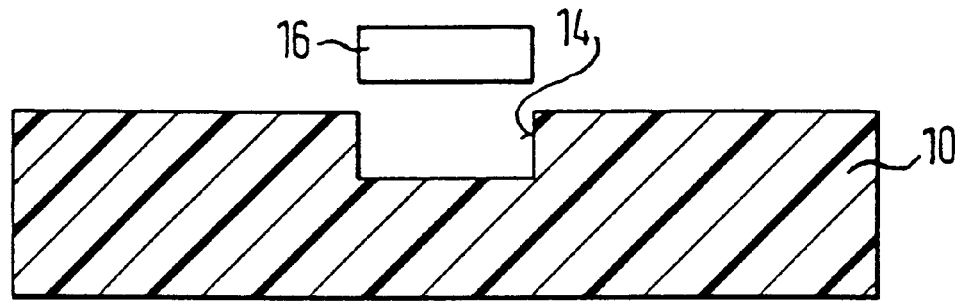
FIG. 14 shows a first step for arranging the electro-optical component in a depression of the printed circuit board in a schematic sectional view.
Figure 15:
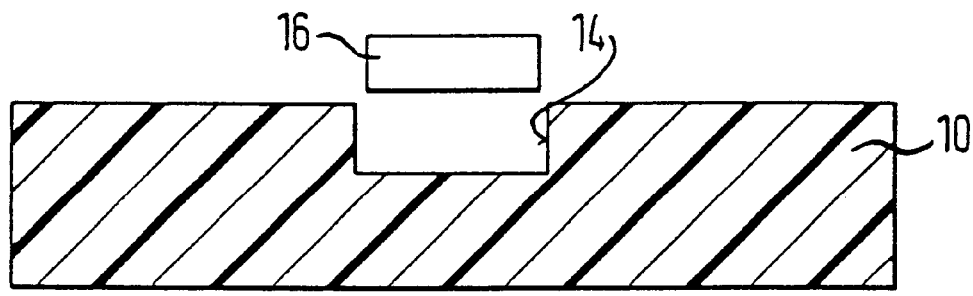
FIG. 15 shows a second step for arranging the electro-optical component in the depression the printed circuit board in a schematic sectional view.
Figure 16:
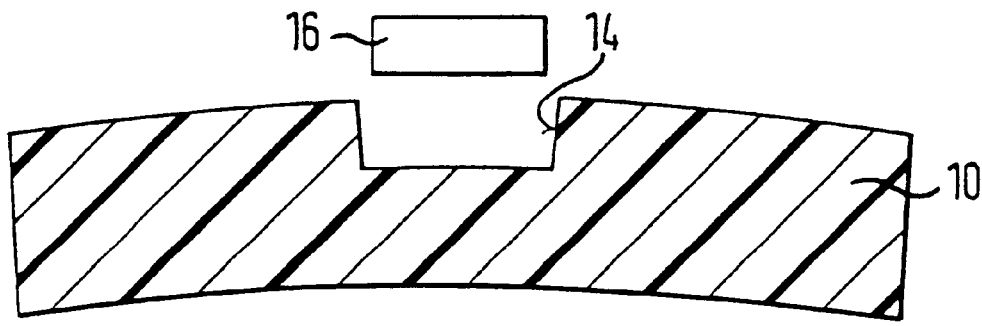
FIG. 16 shows an alternative second step for arranging the electro-optical component in a depression of the printed circuit board in a schematic sectional view.

In FIGS. 14 to 16 there are shown method steps of how the electro-optical component 16 can be received in a safe and reliable way in the depression 14 of the printed circuit board 10. The printed circuit board 10 and the electro-optical component 16 are shown in FIG. 14 in the initial state. The dimensions of the depression 14 are slightly smaller than the dimensions of the electro-optical component 16.

In FIG. 15 the printed circuit board 10 is heated from its initial temperature, which for instance may amount to 20° C., to a temperature of for instance 100° C. The thermal expansion occurring therewith serves for the dimensions of the depression 14 becoming larger, so that the electro-optical component can now be inserted in the depression without any problems. Once the printed circuit board 10 has cooled down to its initial temperature, the walls of the depression 14 due to the shrinkage occurring therewith have laid on the electro-optical component 16, with the result that the latter is held in the depression 14 with a press fit. Thus, no further measures are required to secure the electro-optical component to the printed circuit board 10.

In FIG. 16 there is shown the printed circuit board in a slightly bent state. There, the depression 14 widens up so that the electro-optical component 16 can now be inserted in it. After the printed circuit board 10 has come back to its initial state, the electro-optical component 16 is held in the depression 14 by means of a press fit. This type of attaching is, however, only suitable if the printed circuit board 10 has a sufficient elasticity.

Figure 17:
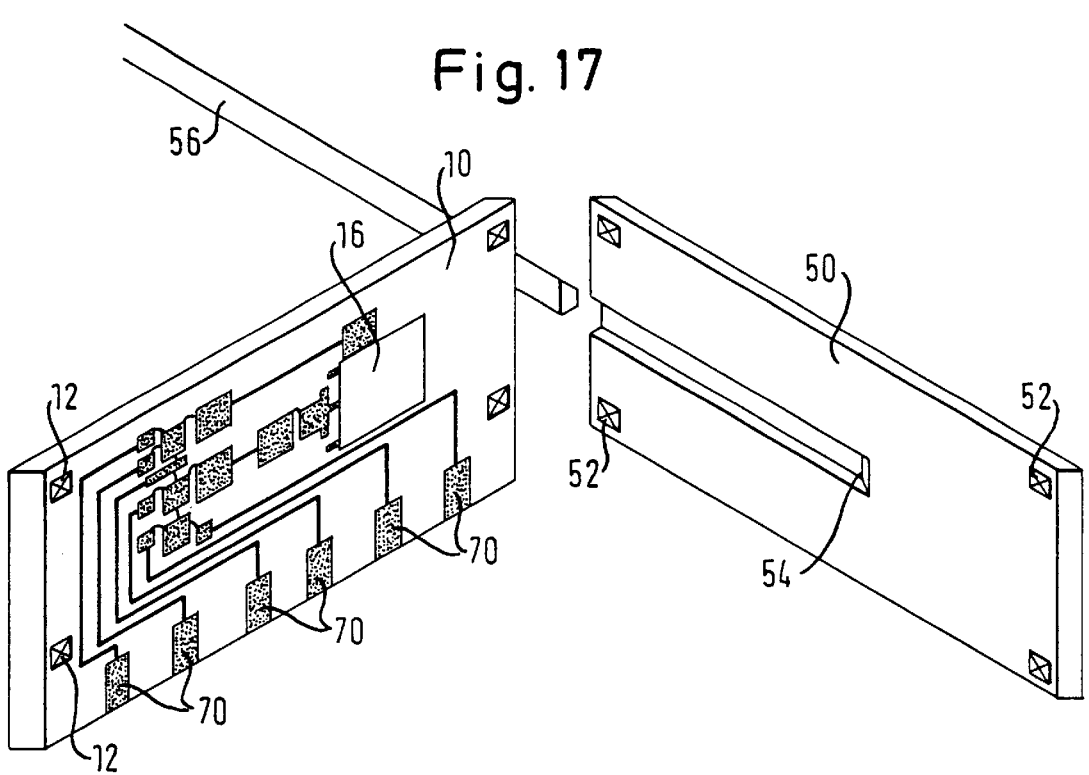
FIG. 17 shows an assembly unit according to a seventh embodiment of the invention in a perspective exploded view.
Figure 18:
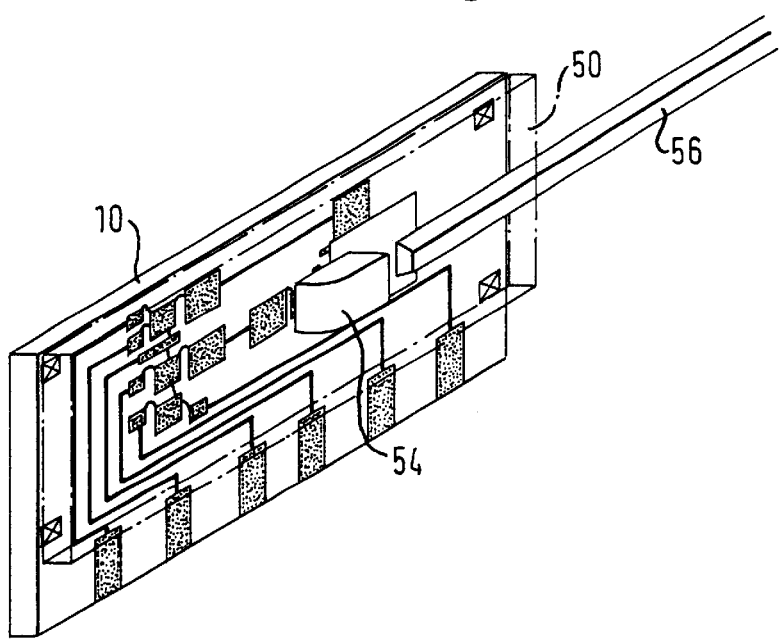
FIG. 18 shows the assembly unit of the seventh embodiment of the invention in a perspective schematic view.

In FIGS. 17 and 18 there is shown an assembly unit according to a seventh embodiment of to the invention. In this embodiment, the printed circuit board 10 is provided with large-area contact portions 70 which have been generated by a suitable metallization. With these contact portions, the printed circuit board can be plugged into a SIMM plug in a manner comparable with today's computer mainboards.

In FIGS. 19 and 20 is shown an assembly unit according to an eighth embodiment of to the invention. In this embodiment, the groove provided in the substrate 50, in which the waveguide will be formed, serves as the positioning formation 52 for the printed circuit board 10 to be inserted. The latter is provided with adjustment formations 12 which are formed by the outer edges of an extension. A parabolic mirror 54, in the interior of which is arranged a transmission chip 16, is arranged in this extension. This embodiment is distinguished in that no separate positioning formations are required, rather the walls of the groove which already are structured with high accuracy ensuing the alignment of the printed circuit board.

An important feature which is common to all embodiments shown lies in the fact that both the printed circuit board 10 with the parts arranged thereon, in particular the electro-optical component 16, and the optical component—at option with the substrate 50 to which it is attached, constitute separate subassembly units, which can be checked in terms of correct functioning independently of each other. This means that, should a malfunction of individual parts arise, only the subassembly unit concerned has to be rejected and not the whole assembly unit.

According to a further development (not shown) of the invention it is possible to configure the substrate as a plug which bears the optical components, for instance in the form of optical fibers, and on which the suitably structured printed circuit board can be plugged.

A further advantage is that in addition to the adjustment formations further latching structures for various components can be provided on the surface of the printed circuit board, for instance V-shaped grooves, so that it is possible to precisely mount butt-coupled integrated-optical components on the printed circuit board, as well as fiber- and fiber ribbon plugs or fiber- and fiber ribbons.

What is claimed is:

1. An assembly unit of a printed circuit board (10) and an optical component (54, 56, 58), the printed circuit board (10) being provided with at least one electro-optical component (16), at least one conducting track (24) for the connection of the electro-optical component (16), as well as a three-dimensional, microstructured adjustment formation (12), the electro-optical component (16) being precisely arranged relative to the latter, and a three-dimensional positioning formation (52) being provided on the optical component (54, 56, 58) and engaging the adjustment formation (12) of the printed circuit board (10) in such a way that the optical component (54, 56, 58) is precisely coupled with the electro-optical component (16) of the printed circuit board (10), characterized in that the electro-optical component (16) is received in a microstructured depression (14) in the printed circuit board (10).

2. The assembly unit according to claim 1, characterized in that the printed circuit board (10) is an injection-molded part which is partially provided with a metallization.

3. The assembly unit according to claim 2, characterized in that the printed circuit board (10) is provided with large-area contact portions (70) onto which a plug can be plugged.

4. The assembly unit according to claim 1, characterized in that a cooling body (26) is arranged at the bottom of the depression (14).

5. The assembly unit according to claim 4, characterized in that the cooling body (26) is electrically conductive and is in electrically conductive connection with the electro-optical component (16), so that it serves as a terminal member for the electro-optical component (16).

6. The assembly unit according to any of the claims 1 to 5, characterized in that a press fit is provided between the electro-optical component (16) and the depression (14) of the printed circuit board.

7. The assembly unit according to claim 6, characterized in that the electro-optical component (16) has a rectangular base and the depression is formed by a circular milled receiving hole (14'), the dimensions of which are smaller than the diagonals of the base, and that four adjustment holes (14") are provided which are assigned to the corners of the electro-optical component (16) and whose lines of intersection with the wall of the milled receiving hole serve for precisely aligning the electro-optical component (16).

8. The assembly unit according to claim 7, characterized in that the electro-optical component (16) is a component which emits light without preferred direction perpendicular to its surface, and the wall of the depression forms a parabolic reflector (32) which focuses the emitted light towards the optical component (54, 56, 58).

9. The assembly unit according to claim 8, characterized in that the optical component is an optical fiber (58), the outer contour of which forms the positioning formation (52), and that the adjustment formation (12) of the printed circuit board (10), which engages the positioning formation (52) is formed by a guiding groove (12) for the optical fiber (58), the fiber being received in the groove.

10. The assembly unit according to claim 1, characterized in that the optical component (54, 56) is arranged on a substrate (50) on which the positioning formation (52) is formed, the latter being microstructured.

11. The assembly unit according to claim 10, characterized in that the optical component of the substrate (50) is a waveguide (56).

12. The assembly unit according to claim 10, characterized in that the optical component of the substrate (50) is a mirror (54).

13. The assembly unit according to claim 12, characterized in that the mirror is a concave mirror (54).

14. An assembly unit of a printed circuit board (10) and an optical component (54, 56, 58), the printed circuit board (10) being provided with at least one electro-optical component (16), at least one conducting track (24) for the connection of the electro-optical component (16), as well as a three-dimensional, microstructured adjustment formation (12), the electro-optical component (16) being precisely arranged relative to the latter, and a three-dimensional positioning formation (52) being provided on the optical component (54, 56, 58) and engaging the adjustment formation (12) of the printed circuit board (10) in such a way that the optical component (54, 56, 58) is precisely coupled with the electro-optical component (16) of the printed circuit board (10), characterized in that the adjustment formation consists of a raised adjustment cross (12).

15. A method for producing an assembly unit of a printed circuit board (10) on which at least one electro-optical component (16) is arranged, and an optical component (54, 56, 58) which is coupled with the electro-optical component (16), the method comprising the following steps:

a printed circuit board blank (10') is injection-molded, a depression (14) being formed for receiving the electro-optical component (16) and a three-dimensional, microstructured adjustment formation (12) being formed;

the printed circuit board blank (10') is finished by it being partially metallized, so that a conducting track (24) is formed;

the electro-optical component (16) is arranged in the depression (14) and connected with the conducting track (24);

an optical component (54, 56, 58) is provided separately from the printed circuit board (10), which optical component is provided with a three-dimensional positioning formation (52);

the printed circuit board (10) and the optical component (54, 56, 58) are assembled, the adjustment and positioning formations (12, 52) engaging into each other and leading to a precise alignment of the printed circuit board (10) and the optical component (54, 56, 58) relative to each other;

the printed circuit board (10) and the optical component (54, 56, 58) are secured to each other.

16. The method according to claim 15, characterized in that the printed circuit board blank (10') is injection-molded, the depression (14) for receiving the electro-optical component (16) and the three-dimensional adjustment formation (12) being formed.

17. The method according to any of the claims 15 and 16, characterized in that the printed circuit board (10) is heated for arranging the electro-optical component (16) in the depression.

18. The method according to any of the claims 15 and 16, characterized in that for arranging the electro-optical component (16) in the depression (14), the printed circuit board (10) is bent such that the depression (14) widens.

19. The method according to any of the claims 15 and 16, characterized in that the printed circuit board (10) and the optical component (58) are directly bonded to each other.

20. The method according to any of the claims 15 and 16, characterized in that the optical component (54, 56) is attached to a substrate (50) on which the positioning formation (52) is formed and which is joined with the printed circuit board (10).

21. The method according to claim 20, characterized in that the substrate (50) and the printed circuit board (10) are bonded to each other.

22. The method according to claim 20, characterized in that the substrate (50) and the printed circuit board (10) are soldered to each other.

23. The method according to any of the claims 15 and 16, characterized in that the electro-optical component (16) of the printed circuit board (10) is checked in terms of its correct functioning, prior to joining the printed circuit board (10) with the optical component (54, 56, 58).

24. The method according to any of the claims 15 and 16, characterized in that the optical component (54, 56, 58) is checked in terms of its correct functioning, prior to joining the printed circuit board (10) with the optical component (54, 56, 58).

* * * * *